(12) United States Patent
Anaxagoras

(10) Patent No.: US 9,184,192 B2
(45) Date of Patent: Nov. 10, 2015

(54) RADIATION DETECTOR AND METHOD HAVING A SOURCE FOLLOWER ARRANGEMENT FORMED BY A SOURCE FOLLOWER INPUT TRANSISTOR AND A BIAS CURRENT PORTION VIA A BIAS LINE SELECT TRANSISTOR

(75) Inventor: Thalis Anaxagoras, London (GB)

(73) Assignee: ISDI Limited, London (GB)

( * ) Notice: Subject to any disclaimer, the term of this patent is extended or adjusted under 35 U.S.C. 154(b) by 221 days.

(21) Appl. No.: 13/984,757

(22) PCT Filed: Feb. 13, 2012

(86) PCT No.: PCT/GB2012/050316
§ 371 (c)(1),
(2), (4) Date: Aug. 9, 2013

(87) PCT Pub. No.: WO2012/107784
PCT Pub. Date: Aug. 16, 2012

(65) Prior Publication Data
US 2014/0070075 A1 Mar. 13, 2014

(30) Foreign Application Priority Data
Feb. 11, 2011 (GB) .................................. 1102478.3

(51) Int. Cl.
*H01L 27/00* (2006.01)
*H01L 27/146* (2006.01)
*H04N 5/3745* (2011.01)

(52) U.S. Cl.
CPC ...... *H01L 27/14612* (2013.01); *H04N 5/37452* (2013.01)

(58) Field of Classification Search
CPC .................. H01L 27/14609; H01L 27/14601; H01L 27/146

USPC ........ 250/208.1, 214 R, 214.1; 348/302–311; 257/290–292, 440–444
See application file for complete search history.

(56) References Cited

U.S. PATENT DOCUMENTS

| 4,839,735 A | 6/1989 | Kyomasu et al. |
| 5,714,753 A | 2/1998 | Park |

(Continued)

FOREIGN PATENT DOCUMENTS

| EP | 1154310 A2 | 11/2001 |
| EP | 1 233 459 A1 | 8/2002 |

(Continued)

OTHER PUBLICATIONS

International Search Report corresponding with International Patent Application No. PCT/GB/2012/050316; Date of Mailing of the International Search Report Sep. 19, 2012; 6 Pages.

*Primary Examiner* — Que T Le
(74) *Attorney, Agent, or Firm* — Myers Bigel Sibley & Sajovec

(57) ABSTRACT

Embodiments of the invention provide a radiation detector comprising a pixel element, the pixel element comprising: a first diode element having a node capacitance associated therewith, the element being operable to pass electrical charge therethrough between terminals thereof in response to incident radiation; and an auxiliary charge storage reservoir, wherein the detector is operable by means of charge transfer between the auxiliary charge storage reservoir and a first terminal of the first diode element to reduce a rate at which an electrical potential $V_X$ of the first terminal changes in response to a cumulative amount of incident radiation.

12 Claims, 11 Drawing Sheets

(56) References Cited

U.S. PATENT DOCUMENTS

| | | | |
|---|---|---|---|
| 5,729,287 A | 3/1998 | Morimoto | |
| 6,043,478 A | 3/2000 | Wang | |
| 6,215,113 B1 | 4/2001 | Chen et al. | |
| 6,369,853 B1 | 4/2002 | Merrill et al. | |
| 6,410,899 B1 * | 6/2002 | Merrill et al. | 250/208.1 |
| 6,697,114 B1 | 2/2004 | Merrill | |
| 6,831,692 B1 | 12/2004 | Oda | |
| 8,319,307 B1 | 11/2012 | Williams | |
| 2002/0196352 A1 | 12/2002 | Boemler | |
| 2004/0012834 A1 | 1/2004 | Schwarte | |
| 2004/0041077 A1 | 3/2004 | Fossum | |
| 2004/0046883 A1 | 3/2004 | Suzuki | |
| 2004/0096124 A1 | 5/2004 | Nakamura | |
| 2004/0108564 A1 | 6/2004 | Mitra | |
| 2004/0223065 A1 | 11/2004 | Takayanagi | |
| 2005/0110093 A1 | 5/2005 | Altice, Jr. et al. | |
| 2006/0011807 A1 | 1/2006 | Lee et al. | |
| 2006/0050352 A1 | 3/2006 | Schwarte | |
| 2006/0146159 A1 | 7/2006 | Farrier | |
| 2006/0181626 A1 | 8/2006 | Lee | |
| 2006/0231875 A1 | 10/2006 | Patrick et al. | |
| 2006/0255380 A1 | 11/2006 | Lee | |
| 2007/0023798 A1 | 2/2007 | McKee | |
| 2007/0063299 A1 | 3/2007 | Hwang | |
| 2007/0075338 A1 | 4/2007 | Park et al. | |
| 2007/0139740 A1 | 6/2007 | Igura et al. | |
| 2008/0164403 A1 | 7/2008 | Hall et al. | |
| 2009/0008532 A1 | 1/2009 | Setoguchi | |
| 2009/0072120 A1 | 3/2009 | McGarry et al. | |
| 2009/0114961 A1 | 5/2009 | Ki | |
| 2009/0141155 A1 | 6/2009 | Ellis-Monaghan | |
| 2009/0251576 A1 | 10/2009 | Hattori et al. | |
| 2009/0321800 A1 | 12/2009 | Ohkawa | |
| 2010/0097518 A1 | 4/2010 | Ahn | |
| 2010/0188491 A1 | 7/2010 | Shizukuishi | |
| 2010/0309352 A1 | 12/2010 | Mashiyama | |

FOREIGN PATENT DOCUMENTS

| | | |
|---|---|---|
| EP | 1 435 662 A2 | 7/2004 |
| EP | 1 858 082 A1 | 11/2007 |
| EP | 2 133 918 A2 | 12/2009 |
| GB | 2 330 905 A | 5/1999 |
| JP | 2005012007 A | 1/2005 |
| JP | 2010273383 A | 12/2010 |
| WO | WO 99/66560 A1 | 12/1999 |
| WO | WO 2005/074250 A1 | 11/2005 |
| WO | WO 2006/073875 A2 | 7/2006 |
| WO | WO 2008/156232 A1 | 12/2008 |
| WO | WO 2012/007744 A1 | 1/2012 |

* cited by examiner

RADIATION DETECTOR AND METHOD HAVING A SOURCE FOLLOWER ARRANGEMENT FORMED BY A SOURCE FOLLOWER INPUT TRANSISTOR AND A BIAS CURRENT PORTION VIA A BIAS LINE SELECT TRANSISTOR

RELATED APPLICATIONS

This application is a 35 U.S.C. §371 national stage application of PCT Application No. PCT/GB2012/050316, filed on 13 Feb. 2012, which claims priority from Great Britain Patent Application No. 1102478.3, filed 11 Feb. 2011, the contents of which are incorporated herein by reference in their entireties. The above-referenced PCT International Application was published in the English language as International Publication No. WO 2012/107784A2 on 16 Aug. 2012.

FIELD OF THE INVENTION

The present invention relates to radiation detectors and to a method of detecting radiation. In particular but not exclusively the invention relates to radiation detectors for imaging devices where an array of radiation detectors is arranged to capture an image of a subject.

BACKGROUND

It is known to provide an imaging device having a radiation detector in the form of a two dimensional array of pixels or pixel elements, each pixel element having a radiation sensor element for detecting radiation incident thereon. An image of a subject may be obtained by the device by projecting radiation onto the detector and determining the relative amounts of radiation incident upon each pixel element over a prescribed time period.

Known detectors include CMOS (complementary metal oxide semiconductor) detectors, CCD (charge coupled device) detectors, image intensifiers and the like. CMOS and CCD detectors are commonly used in domestic hand-held electronic devices such as mobile telephones and video cameras.

Such devices also find application in scientific instrumentation apparatus such as medical imaging systems, electron microscopes including transmission electron microscopes, medical and biological imaging applications, space imaging applications and security applications.

FIG. 1 is a schematic circuit diagram of a known CMOS active pixel element 100 also referred to as a 3T (three transistor) active pixel. The pixel element 100 has a radiation sensor element in the form of a photodiode 110 and three MOS transistors: a reset transistor 121, a source-follower input transistor 131 and a selection ('select') transistor 141. Source-follower input transistor 131 forms a source follower arrangement with current bias portion 150 which comprises a current mirror arrangement. The source-follower input transistor 131 may also be referred to as a source follower transistor 131.

Each of the transistors 121, 131, 141 has a source, a gate and a drain terminal.

The source of the reset transistor 121 is connected to a node X whilst the drain is connected to a supply of potential $V_{RST}$. The gate of the reset transistor 121 is connected to a reset signal line RST. The gate, source and drain of the source-follower input transistor 131 are respectively connected to the node X, the drain of the selection transistor 141 and a supply of reference voltage $V_{DD}$. The gate of the selection transistor 141 is connected to a row select line ROW and the source of the selection transistor 141 is connected to a column readout line COL.

It is to be understood that the source-follower input transistor 131 is arranged to act as a buffer of the signal applied to the gate thereof. When the current flow through the source-follower input transistor 131 is kept constant by an appropriate bias applied by the current bias portion 150 then, neglecting the second order effect of the activated selection transistor 141, the output voltage on the column readout line COL at terminal T is proportional to the potential applied to the gate of the source-follower input transistor 131 but with a much lower equivalent output impedance.

In operation, reset signal line RST is set HIGH (i.e. assumes a logical 1 condition) causing the reset transistor 121 to turn ON (i.e. the channel of the reset transistor 121 becomes conducting) and a potential $V_x$ of the floating node 'X' is set to $V_{RST}$. When the potential at $V_x$ is set to $V_{RST}$, the photodiode 110 stores charge therein due to the node capacitance of the photodiode 110, a region of space charge associated with the photodiode 110 being increased.

The reset signal line RST is then set LOW (i.e. controlled to assume a logical 0 condition) causing reset transistor 121 to turn OFF.

Radiation incident on the diode 110 is converted to mobile electron-hole pairs within the diode 110 causing a current to flow through the diode, discharging the charge accumulated by the photodiode 110 when the reset signal was applied. This in turn causes a change in $V_x$.

When it is required to read out $V_x$ the row of the pixel 100 of FIG. 1 is selected by turning ON the selection transistor 141 (i.e. row line ROW is set HIGH). A signal corresponding to $V_x$ is then applied by the selection transistor 141 to the column line COL which may also be referred to as an output line OUTP. The column line COL is in turn connected to signal processing electronics which reads out the potential at an output terminal T of the column line COL.

Periodically, reset signal line RST is set HIGH, connecting floating node X to $V_{RST}$ via reset transistor 121 and refreshing the amount of charge stored by the photodiode 110 due to its node capacitance. The potential at node X is thereby reset to $V_{RST}$.

Applying $V_{RST}$ to the diode 110 biases the diode 110 and therefore $V_{RST}$ may be referred to as a bias voltage. In the embodiment of FIG. 1 $V_{RST}$ is arranged to reverse bias the diode 110 to increase the width of the depletion layer and improve detection response time. Furthermore it should be noted that the higher the reset voltage the more charge may be collected by the photodiode 110 before saturation.

It is to be understood that in the arrangement of FIG. 1 $V_x$ is monotonically dependant on the cumulative number of photo-generated electrons collected by the diode 110, which is in turn typically monotonically dependant on the level of illumination, specifically the illuminance (the total incident luminous flux, per unit area).

When the amount of accumulated charge at the diode 110 falls to a sufficiently low value $V_x$ ceases to change with further illumination and the diode 110 may be considered to be 'saturated'.

It is to be understood that the amount of charge passed by the diode before reaching saturation depends on the node capacitance of the diode 110. The larger the node capacitance, the more charge can be passed by the diode 110 before saturation conditions are reached, and the greater the dynamic range of the pixel element 100. However, increasing the node capacitance causes an increase in the sampling noise (reset noise on node X) in the output signal of the pixel element 100 (i.e. the total potential read out at column line COL) reducing the signal to noise ratio (SNR). Therefore, in the device shown in FIG. 1 there is a trade-off between dynamic range and noise.

It is desirable to improve the dynamic range of pixels of radiation detectors to reduce a risk of saturation of the pixels 100 under high intensity illumination conditions without reducing the SNR.

Furthermore it is also desirable to reduce a problem of image gradient effects due to a drop in potential across output signal lines of pixel element arrays.

It is also desirable to enhance operational functionality of a radiation detector comprising a pixel element array.

Embodiments of the invention endeavour to mitigate at least one of the disadvantages of known radiation detectors.

STATEMENT OF THE INVENTION

Embodiments of the invention may be understood by reference to the appended claims.

Aspects of the invention provide a detector and a method as claimed in the appended claims.

In another aspect of the invention for which protection is sought there is provided a radiation detector comprising a pixel, the pixel comprising:
  a first diode element operable to pass electrical charge therethrough between terminals thereof in response to incident radiation; and
  an auxiliary charge storage reservoir,
  wherein the detector is operable to transfer charge between the auxiliary charge storage reservoir and a first terminal of the first diode element thereby to reduce a rate at which an electrical potential $V_X$ of the first terminal changes in response to the cumulative amount of radiation incident thereon.

Embodiments of the invention have the advantage that a dynamic range of a detector may be increased by the addition of an auxiliary charge storage reservoir.

The first diode element may have a diode (or node) capacitance associated therewith.

In a further aspect of the invention for which protection is sought there is provided a radiation detector comprising a pixel element, the pixel element comprising:
  a first diode element having a node capacitance associated therewith, the element being operable to pass electrical charge therethrough between terminals thereof in response to incident radiation; and
  an auxiliary charge storage reservoir,
  wherein the detector is operable by means of charge transfer between the auxiliary charge storage reservoir and a first terminal of the first diode element to reduce a rate at which an electrical potential $V_X$ of the first terminal changes in response to a cumulative amount of incident radiation.

Advantageously the pixel element is arranged such that $V_X$ is responsive to the amount of charge stored by the node capacitance of the first diode element.

$V_X$ may be responsive to the amount of charge in stored in the first diode element due to the node capacitance thereof and the amount of charge stored in the auxiliary charge storage reservoir, which may advantageously be a capacitor.

Further advantageously the detector is operable to couple a first terminal of the auxiliary charge storage reservoir to the first terminal of the diode element when $V_X$ falls below a potential $V_F$ of the first terminal of the charge storage reservoir.

The detector may be operable to set $V_X$ to one of a first reset value and a second reset value.

The detector may be operable to set $V_F$ to one of a first reset value and a second reset value.

The detector may be operable to set $V_X$ to a first reset value and $V_F$ to a second reset value.

Optionally the first reset value is greater than the second reset value.

Alternatively the first reset value may be substantially equal to the second reset value.

In a further alternative the first reset value may be less than the second reset value.

Advantageously the auxiliary charge reservoir is coupled to the first diode element by means of a second diode element.

The second diode element may comprise a transistor device.

The detector may be operable to couple the auxiliary charge reservoir to the first diode element by means of a second diode element.

This has the advantage that the detector may be decoupled from the auxiliary charge reservoir.

The detector may be operable to couple the auxiliary charge reservoir to the first diode element thereby to permit bidirectional current flow therebetween.

Advantageously the detector comprises an array of pixel elements, the array comprising at least one column comprising a plurality of pixel elements, each pixel element comprising a source follower input transistor having a gate terminal coupled to the first terminal of the first diode element thereof whereby a potential may be applied to the gate terminal of the source follower input transistor, the potential being responsive to the cumulative amount of incident radiation incident on the pixel element.

Whilst the pixel elements have been described as being in the form of a column, it is to be understood that in some arrangements the pixel elements may be described as being in a row, being equivalent to a column, whilst still falling within the scope of the present invention for which protection is sought. A column or row of pixel elements need not be a straight column or row, but may be non-linear, for example curved, or any other suitable arrangement or distribution.

Advantageously a source of each input transistor of the at least one column is connectable by means of a respective bias line select transistor to a bias current signal line having a bias current portion connected thereto, the bias current portion being configured to apply a bias current to the bias current signal line, wherein the source follower input transistor and bias current portion form a source follower arrangement via the bias line select transistor,
  the source of the source follower input transistor of each pixel element being further connectable by means of a respective output line select transistor to an output signal line separate from the bias signal line.

The bias current signal line may be a common bias current signal line of a given column. The output signal line may be a common output signal line of a given column.

It is to be understood that by connecting the source of the source follower input transistor to the bias current signal line and the output signal line, the potential of the output signal line may be caused to follow that of the potential applied to the gate terminal of the source follower input transistor.

Embodiments of the invention have the advantage that an output potential at an output terminal T of the output signal line, having a potential responsive to the amount of radiation incident on a given pixel element of a column, is not modified due to a line resistance associated with the output line. This is because a potential of the output line may be measured without drawing current through the output signal line.

It is to be understood that in prior art circuits where current is drawn through the output signal line, a drop in potential between the source of a given source follower input transistor and an output terminal of the output signal line may occur due to the line resistance associated with the output signal line. This reduces the value of the potential measured at the output terminal. In the case of a 2D array of pixel elements used to capture a 2D image associated with incident radiation, a gradient in image intensity may be found to be superimposed on captured image data due to line resistance. It is to be understood that the longer the length of line between a given source follower input transistor and the output terminal of the corresponding output signal line, the greater the drop in potential suffered at the output terminal. This drop in potential may result in the introduction of artefacts into captured images, such as the intensity gradient referred to above.

Advantageously the detector comprises a plurality of columns of pixel elements, each column having: a respective bias signal line having a bias portion; and a respective output signal line.

It is to be understood that the detector may be considered to comprise rows of pixel elements forming a row of columns of pixel elements. The detector may be operable to read out the potential at the source of a source follower input transistor of each pixel element of a row of pixel elements to a respective column output signal line, i.e. one pixel element per column. The detector may be operable to read out the potentials row by row in sequence thereby to read out the potential at the source of each source follower input transistor of an array.

Advantageously the column comprises respective first and second bias current signal lines connectable by means of respective first and second bias line select transistors to the source of the source follower.

This feature has the advantage for example that respective different bias current signals may be applied to a source follower input transistor of a given pixel element at different moments in time.

Optionally each bias current signal line has a respective bias current portion.

Advantageously the column comprises respective first and second output signal lines connectable by means of respective first and second output line select transistors to the source of the source follower.

Thus the detector may be operable to read out a potential corresponding to a cumulative amount of incident radiation on a pixel element to two different output signal lines.

Advantageously the detector is operable to apply the potential at the source of the source follower input transistor of a given pixel element of a column to both the first and second output lines at the same moment in time.

Thus the potential at the source of the source follower input transistor may be applied to both output lines substantially simultaneously.

Advantageously the detector is operable to connect only one bias current signal line to the source of the source follower when more than one output signal line is connected to the source of the source follower input transistor.

It is to be understood that if both bias current signal lines are coupled to the source of the source follower transistor the current flow through the source follower will be substantially equal to the sum of the currents flowing through the respective bias current portions of the bias current lines, resulting in an erroneous measure of the amount of radiation detected by a given pixel element.

Advantageously the or each bias current portion comprises a constant current source.

Optionally each pixel element comprises a plurality of source follower input transistors coupled to the first terminal of the first diode, the circuit being operable to cause a bias current to flow through each source follower input transistor via a bias current portion thereby to provide a plurality of respective source follower arrangements.

Embodiments of the present invention allow a plurality of output terminals to be provided for a single pixel element in a convenient manner.

The bias current portion may comprise a current mirror arrangement.

Advantageously the source of each source follower input transistor is coupled to a bias current signal line whereby the bias current may be provided.

Optionally the source of each source follower input transistor is coupled to the bias current signal line by means of a select transistor operable to connect and disconnect the input transistor from the bias current signal line.

Advantageously the source of each source follower is coupled to a respective different bias current signal line by means of a respective different bias current signal line select transistor.

Advantageously the detector comprises a column of pixel elements, the source of each of the plurality of source follower input transistors of each pixel element of the column being connectable to a respective output signal line by means of a respective output signal line select transistor.

Advantageously corresponding source follower input transistors of respective pixels of a column of pixels share a common output signal line.

That is, first source follower input transistors of each pixel element of a column share a common first output signal line whilst second source follower input transistors of each pixel element of a column share a second common output signal line different from the first, and so forth if there are more than two source follower input transistors per pixel element.

Advantageously electrical connections to each of the bias signal lines and each of the output signal lines of the detector are provided along a single common side of the detector.

Thus electrical connection may be made to the bias current signal lines and output signal lines along a single common side (or edge) of the detector.

In a further aspect of the invention there is provided a detector assembly comprising a plurality of detectors according to the preceding aspect.

Advantageously the assembly comprises first, second, third and fourth detectors each having four sides, the first detector having the second to fourth detectors arranged to abut three respective sides thereof, wherein electrical connection to the bias current signal lines and output signal lines of the first detector is provided along a free edge of the first detector being the edge not having any one of the second to fourth detectors in abutment therewith.

In another aspect of the invention for which protection is sought there is provided a method of detecting radiation comprising:

passing electrical charge through a first diode element having a node capacitance associated therewith between terminals thereof in response to incident radiation; and
transferring charge between an auxiliary charge storage reservoir and a first terminal of the first diode element thereby to reduce a rate at which an electrical potential $V_X$ of the first terminal changes in response to a cumulative amount of radiation incident thereon.

Advantageously the method comprises the step of storing charge within the first diode element by means of the node capacitance thereof, the step of passing electrical charge through the first diode element comprising the step of charge stored within the first diode element through the first diode element thereby to discharge the stored charge.

In a further aspect of the invention for which protection is sought there is provided a method of detecting radiation comprising:

passing electrical charge through a first diode element between terminals thereof in response to incident radiation; and transferring charge between an auxiliary charge storage reservoir and a first terminal of the first diode element thereby to reduce a rate at which an electrical potential $V_X$ of the first terminal changes in response to the amount of radiation incident thereon.

Advantageously the method may comprise the step of storing charge in charge storage means within the first diode element.

Further advantageously $V_X$ is responsive to the amount of charge in stored in the first diode element due to the charge storage means and the amount of charge stored in the auxiliary charge storage reservoir.

Still further advantageously the method may comprise the step of coupling a first terminal of the auxiliary charge storage reservoir to the first terminal of the diode element when $V_X$ falls below a potential $V_F$ of the first terminal of the charge storage reservoir.

In one aspect of the invention for which protection is sought there is provided a detector comprising an array of pixel elements, the array comprising a column of pixel elements, each pixel element comprising a source follower input transistor, wherein each pixel element is operable to apply a potential to a gate terminal of the source follower input transistor thereof, the potential having a value responsive to a cumulative amount of charge carriers generated by the pixel element responsive to incident radiation, a source of each source follower input transistor being connectable by means of a respective bias line select transistor to a bias current signal line of the column having a bias current portion connected thereto, wherein the source follower input transistor and bias current portion form a source follower arrangement via the bias line select transistor, the source of the source follower input transistor of each pixel element being further connectable by means of a respective output line select transistor to an output signal line of the column separate from the bias signal line.

It is to be understood that by connecting the source of the source follower input transistor to the bias current signal line and the output signal line, the potential of the output signal line may be caused to follow that of the potential applied to the gate terminal of the source follower input transistor.

Embodiments of the invention have the advantage that an output potential at an output terminal T of the output signal line, having a potential responsive to the amount of radiation incident on a given pixel element, is not modified due to a line resistance associated with the output line. This is because a potential of the output line may be measured without drawing current through the output signal line.

It is to be understood that in prior art detectors where current is drawn through the output signal line, a drop in potential between the source of a given source follower input transistor and an output terminal of the output signal line may occur due to the line resistance associated with the output signal line. This reduces the value of the potential measured at the output terminal. In the case of a 2D array of pixel elements used to capture a 2D image associated with incident radiation, a gradient in image intensity may be found to be superimposed on captured image data due to line resistance. It is to be understood that the longer the length of line between a given source follower input transistor and the output terminal of the corresponding output signal line, the greater the drop in potential suffered at the output terminal. This drop in potential results in the introduction of artefacts into captured images, such as the intensity gradient referred to above.

Advantageously the detector comprises a plurality of columns of pixel elements, each column having: a respective bias signal line having a bias portion; and a respective output signal line.

Advantageously the column comprises respective first and second bias current signal lines connectable by means of respective first and second bias line select transistors to the source of the source follower.

Optionally each bias current signal line has a respective bias current portion.

Advantageously the column comprises respective first and second output signal lines connectable by means of respective first and second output line select transistors to the source of the source follower.

Advantageously the detector is operable to apply the potential at the source of the source follower input transistor to both the first and second output lines at the same moment in time.

Thus the potential at the source of the source follower input transistor may be applied to both output lines substantially simultaneously.

Advantageously the detector is operable to connect only one bias current signal line to the source of the source follower when more than one output signal line is connected to the source of the source follower input transistor.

It is to be understood that if both bias current signal lines are coupled to the source of the source follower transistor the current flow through the source follower will be substantially equal to the sum of the currents flowing through the respective bias current portions of the bias current lines, resulting in an erroneous measure of the amount of radiation detected by a given pixel element.

Optionally the or each bias current portion comprises a constant current source.

Advantageously electrical connections to each of the bias signal lines and each of the output signal lines of the detector are provided along a single common side of the detector.

In a further aspect of the invention there is provided a detector assembly comprising a plurality of detectors according to a preceding aspect.

Advantageously the assembly comprises first, second, third and fourth detectors each having four sides, the first detector having the second to fourth detectors arranged to abut three respective sides thereof, wherein electrical connection to the bias current signal lines and output signal lines of the first detector is provided along a free edge of the detector not having any one of the second to fourth detectors in abutment therewith.

In one aspect of the invention for which protection is sought there is provided a detector comprising a pixel element comprising a plurality of source follower input transistors, the pixel element being operable to apply a potential to a gate terminal of each source follower input transistor corresponding to a cumulative amount of radiation incident upon the pixel element, the detector being operable to cause a bias current to flow through each source follower input transistor thereby to provide respective source follower arrangements.

Embodiments of the present invention allow a plurality of output terminals to be provided for a single pixel element in a convenient manner.

Advantageously the source of each source follower transistor is coupled to a bias current signal line whereby the bias current may flow through the source follower input transistors.

Further advantageously the source of each source follower transistor is coupled to the bias current signal line by means of a select transistor.

Advantageously the source of each source follower is coupled to a respective different bias current signal line by means of a respective different bias current signal line select transistor.

That is, the sources of corresponding source follower input transistors of respective pixels are coupled to a common bias current signal line by means of respective bias current signal line select transistors.

That is, first source follower input transistors of each pixel element of a column have sources that share a first common bias current signal line whilst second source follower input transistors of each pixel element of a column share a second common output signal line, and so forth where there are more than two source follower input transistors per pixel element.

Advantageously the sources of corresponding source follower input transistors of respective pixels of a column are coupled to a common output signal line by means of respective output signal line select transistors.

That is, first source follower input transistors of each pixel element of a column have sources that share a first common output signal line whilst second source follower input transistors of each pixel element of a column share a second common output signal line, and so forth where there are more than two source follower input transistors per pixel element.

In another aspect of the invention for which protection is sought there is provided a method of detecting radiation comprising:

providing a detector comprising an array of pixel elements, the array comprising a column of pixel elements, each pixel element comprising a source follower input transistor;

applying a potential to a gate terminal of the source follower input transistor of a pixel element, the value of the potential being responsive to a cumulative amount of charge carriers generated by the pixel element responsive to incident radiation;

connecting a source of each source follower input transistor by means of a respective bias line select transistor to a bias current signal line thereby to apply a bias current to the source follower input transistor thereby to form a source follower arrangement;

further connecting the source of the source follower input transistor by means of a respective output line select transistor to an output signal line separate from the bias signal line.

In a further aspect of the invention for which protection is sought there is provided a method of detecting radiation comprising:

providing a detector comprising an array of pixel elements, the array comprising a column of pixel elements, each pixel element comprising a plurality of source follower input transistor;

applying a potential to a gate terminal of each of the plurality of source follower input transistors of a pixel element, the value of the potential being responsive to a cumulative amount of charge carriers generated by the pixel element responsive to incident radiation; and causing a bias current to flow through each of the plurality of source follower input transistors of the pixel element thereby to provide respective source follower arrangements.

In a further aspect of the invention for which protection is sought there is provided a radiation detector comprising a pixel, the pixel comprising:

a sensor element operable to pass charge therethrough between terminals thereof in response to incident radiation, the sensor element having a first charge storage reservoir associated therewith; and a second charge storage reservoir, the pixel being operable to allow transfer of charge between a first one of the terminals of the sensor element and a terminal of the second charge storage reservoir, the detector being operable wherein an electrical potential of the first terminal of the sensor element is responsive to an amount of charge stored in the first and second charge storage reservoirs, the detector being arranged to allow an amount of radiation incident upon the sensor element over a prescribed period of time to be determined.

The first charge storage reservoir may be the capacitance of the sensor element which may be a diode.

In further aspects of the invention there is provided:
1. A detector for performing non destructive readout and arranged to read the same row of pixels at different exposure times.
2. A detector for which data at the output stage thereof is delivered separately for each of the frames achieved with the non destructive methods/architecture.
3. A method in which the in pixel source follower input transistor is biased in such a way that gradient problems are avoided when one or two or three side buttable detectors are implemented.
4. A method of layout of large pixel arrays to avoid electrostatic discharge (ESD) problems during handling of the detector comprising attaching one or more scintillators or any other materials on top of the pixel array/detector.

Embodiments of the present invention provide a method of making a 3 side buttable detector and providing the bias current in the in pixel source follower in a way that the resistance of the output lines (long metal tracks) will not provide any gradient effect and increase in fixed pattern noise.

A non-destructive readout architecture which can perform multiple sampling for regions of interest while we are reading out the full frame independently. Data management (outputs) are control separately.

BRIEF DESCRIPTION OF THE DRAWINGS

Embodiments of the invention will now be described with reference to the accompanying figures in which.

DETAILED DESCRIPTION

Figure 1:
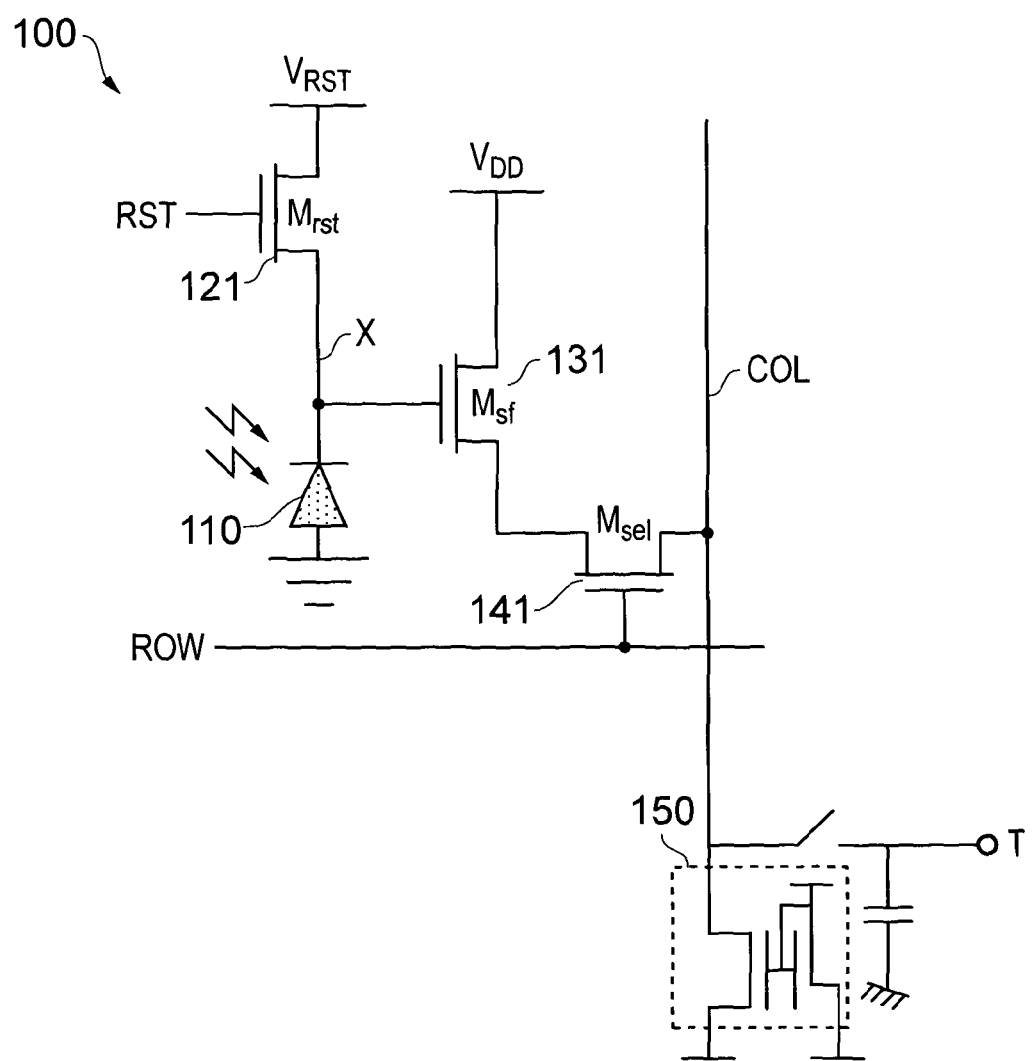
FIG. 1 is a schematic illustration of a known active pixel of a CMOS radiation detector.
Figure 2A:
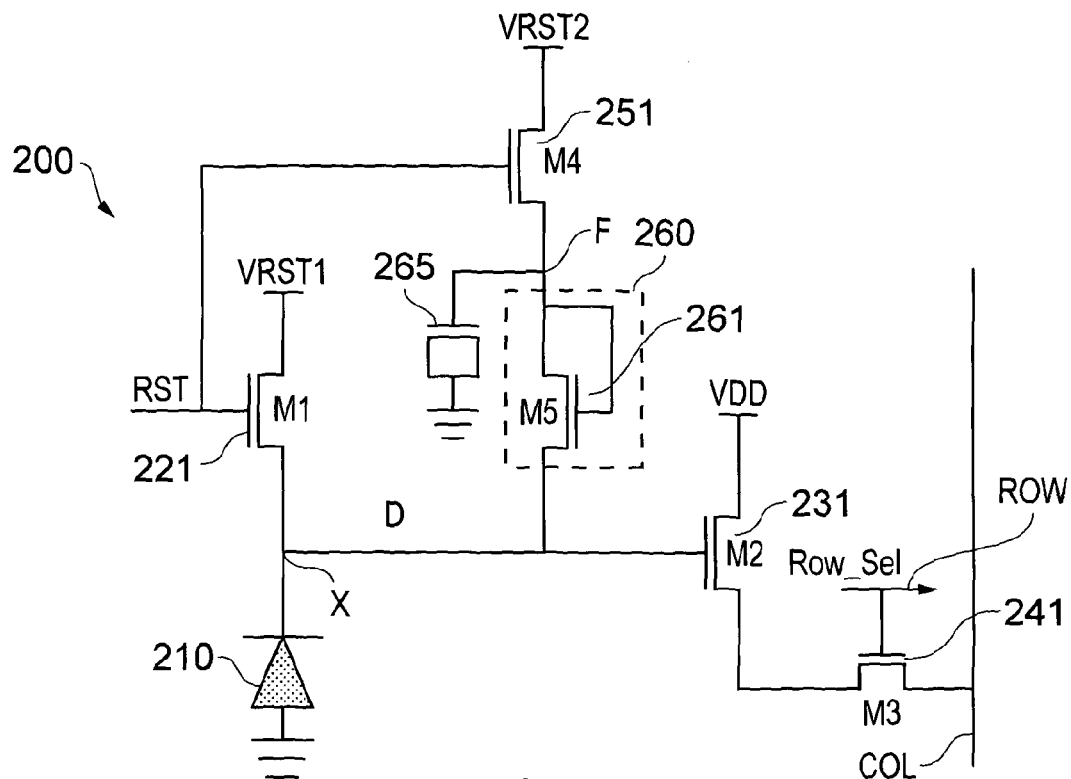
FIG. 2 is a schematic illustration of an active pixel of a CMOS radiation detector according to an embodiment of the invention in which (a) a transistor diode is employed between a charge storage device and a photodiode and (b) a diode device is employed between the charge storage device and the photodiode.

FIG. 2(a) shows an active pixel element 200 according to an embodiment of the invention. Like features of the pixel element 200 of FIG. 2(a) to those of the prior art pixel element 100 of FIG. 1 are provided with like reference signs prefixed numeral 2 instead of numeral 1.

The pixel element 200 has a photodiode 210 coupled to a source of a first reset transistor 221 and a gate of a source follower input transistor 231 at a floating node X in a similar manner to the pixel element 100 of FIG. 1.

The drain of the first reset transistor 221 is connected to a first supply of potential $V_{RST1}$, whilst the gate is connected to a reset signal line RST.

The source and drain of the source-follower input transistor 231 are respectively connected to the drain of a selection transistor 241 and a supply of reference voltage $V_{DD}$. The gate of the selection transistor 241 is connected to a row select line ROW and the source of the selection transistor 241 is connected a column readout line COL. It is to be understood that the potential $V_X$ at node X may be read out via the column readout line COL by turning ON the selection transistor 241 by means of the row select line ROW.

Figure 2B:
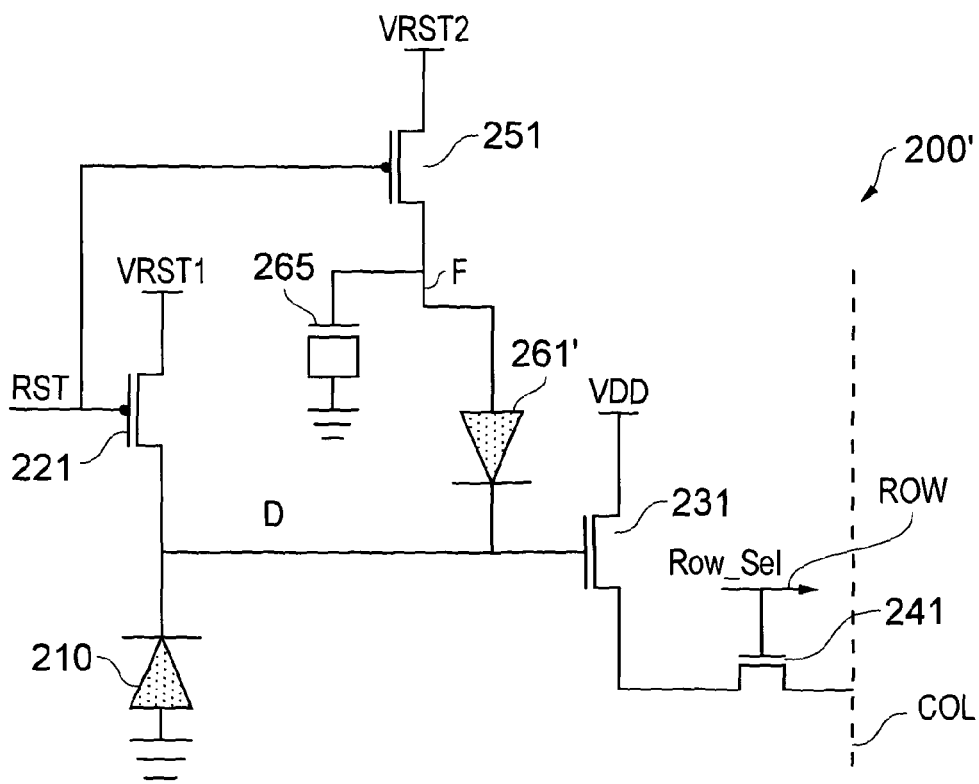

The pixel element 200 is further provided with a capacitor 265 coupled between the floating node X and ground by means of a diode element 260. In the embodiment of FIG. 2(a) the diode element 260 is provided by a transistor 261 having its gate connected to node F between the capacitor 265 and the diode element 260. It is to be understood that in some embodiments the diode element 260 may alternatively or in addition be provided by a diode instead of a transistor. An example of such a configuration is shown in FIG. 2(b) where the transistor diode 261 of FIG. 2(a) has been replaced by a p-n junction diode device 261'.

In some other embodiments the gate of transistor 261 may be connected to an inverter or amplifier or comparator or any other pixel element internal or external potential to control the switching point and the behaviour of the transistor 261. Devices other than a transistor 261 may also be used such as a diode as noted above or any other suitable device.

Node F is coupled to a source of a second reset transistor 251 with its drain connected to a second supply of potential $V_{RST2}$. The gate of the second reset transistor 251 is connected to the reset signal line RST. In some embodiments separate reset signal lines are provided for applying respective potentials to the gates of the first and second reset transistors 221, 251 independently of one another.

In operation the potential of the first supply $V_{RST1}$ is set to a value greater than that of the second supply $V_{RST2}$. The reset signal line RST is set HIGH turning ON the first and second reset transistors 221, 251. This causes the potential $V_X$ of the floating node 'X' to be set to a value $V_{RST1}$ as charge accumulates in the photodiode 210 and the potential $V_F$ of node F to be set to a value $V_{RST2}$ as charge accumulates in capacitor 265.

The reset signal line RST is then set LOW, turning OFF the first and second reset transistors 221, 251.

It is to be understood that the value of $V_{RST1}$ is arranged to cause the photodiode 210 to be placed under a reverse bias condition. Thus, radiation incident upon the "photodiode" 210 will cause accumulated charge due to the junction capacitance of the photodiode 210 to be discharged to ground reducing the potential $V_X$.

As charge is conducted through the photodiode 210 $V_X$ falls at a relatively high rate due to the relatively low capacitance of the photodiode 210.

It is to be understood that because $V_{RST2}$ is less than $V_{RST1}$, $V_X$ will eventually fall below $V_F$ causing the diode element 260 to start conducting thereby connecting capacitor 265 in parallel with photodiode 210. This causes the capacitor 265 to discharge through the photodiode 210. Due to the presence of a relatively large amount of charge in capacitor 265, the rate of change of $V_X$ as a function of the amount of charge that has flowed through the diode 210 decreases substantially as $V_X$ falls below $V_F$.

It is to be understood that the rate at which $V_F$ decays will depend upon the capacitance of the capacitor 265. Higher values of capacitance will typically result in a reduced rate of decay of $V_F$ compared with lower values.

It is to be understood that reset transistors 221 and 251 may be PMOS or NMOS transistors without affecting operation of the pixel element 200. Use of NMOS devices has the advantage that KTC noise may be reduced at nodes X and F after resetting the nodes by means of the reset transistors 221, 251.

Figure 3:
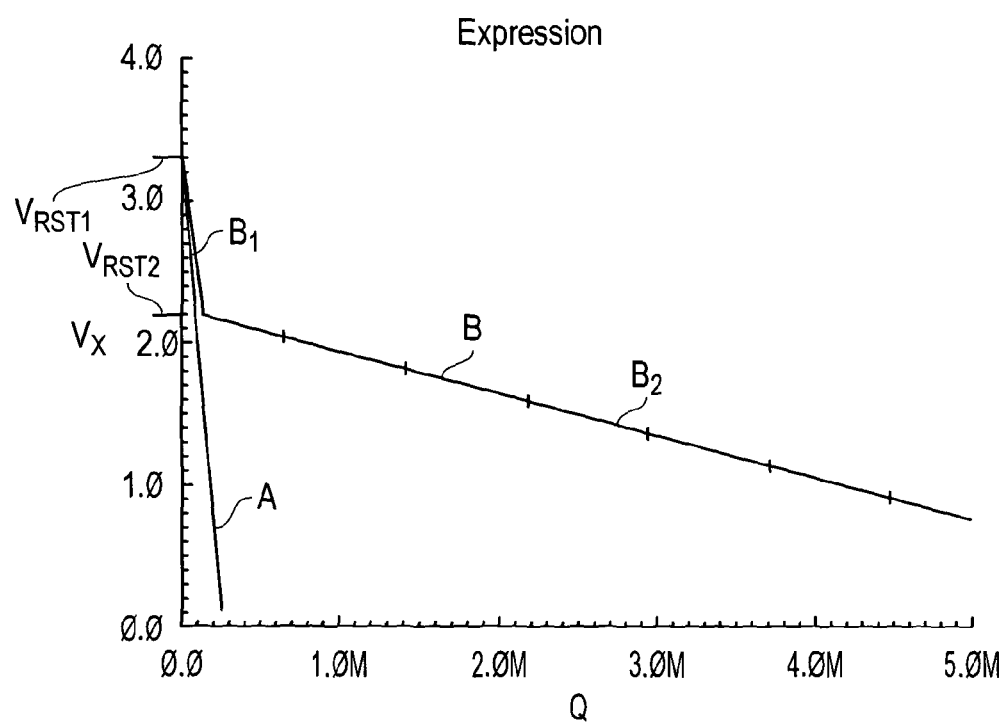
FIG. 3 is a plot of a potential as measured at node X of the circuit of FIG. 1 and FIG. 2 as a function of time under constant illumination conditions.

FIG. 3 is a plot of $V_X$ as a function of the amount of charge conducted through the photodiode 110 of the pixel element 100 of FIG. 1 (trace A) and the photodiode 210 of FIG. 2 (trace B) under constant illumination (obtained by simulation).

It can be seen that in the absence of the capacitor 265 $V_X$ falls at a relatively rapid rate towards zero (trace A).

In contrast, in the embodiment of FIG. 2(a) the rate of change of $V_X$ as a function of the amount of charge passing through the diode 210 is different when $V_X$ is above $V_{RST2}$ (portion $B_1$ of trace B) compared with that when $V_X$ is below $V_{RST2}$ (portion $B_2$ of trace B) (FIG. 3). It can be seen that pixel element 200 behaves in a very similar manner over portion $B_1$ of trace B to pixel element 100 (trace A). A slight difference in signal slope can be seen due to the small capacitance overhead of diode device 261. This capacitance contribution could be reduced by resizing the diode capacitance to compensate if required, without loss of performance.

It is to be understood that embodiments of the invention have the advantage that where a pixel element 200 is exposed to relatively small amounts of incident radiation the response ("gain") of the pixel element 200 (change in $V_X$ as a function of the amount of incident radiation) will be relatively large provided $V_X$ remains above $V_F$.

However, for relatively large amounts of incident radiation, where $V_X$ is expected to fall below $V_F$, $V_X$ falls at a reduced rate as a function of the amount of incident radiation when $V_X$ falls below $V_F$. This has the advantage of reducing a risk that $V_X$ stops changing as a function of further incident radiation (i.e. saturation conditions are achieved) before $V_X$ is read out at the column signal line COL.

It is to be understood that in some embodiments the value of $V_{RST2}$ (and therefore $V_F$) may be adjusted according to the anticipated illumination level of the pixel element 200. In some embodiments the value of $V_{RST2}$ may be a 'factory preset' value. In some embodiments a user may be able to set the value of $V_{RST2}$.

It is to be understood that the value of $V_{RST2}$ (and of the capacitance of capacitor 265) may be chosen so as to obtain a suitable trade off between dynamic range (obtained by employing higher values of capacitance and/or higher values of $V_{RST2}$, i.e. values of $V_{RST2}$ closer to that of $V_{RST1}$) and sensitivity to incident radiation levels (by employing lower levels of capacitance and/or lower levels of $V_{RST2}$).

It is to be understood that sensitivity to incident radiation levels is determined at least in part by the rate of change of $V_X$ as a function of incident radiation.

Figure 4:
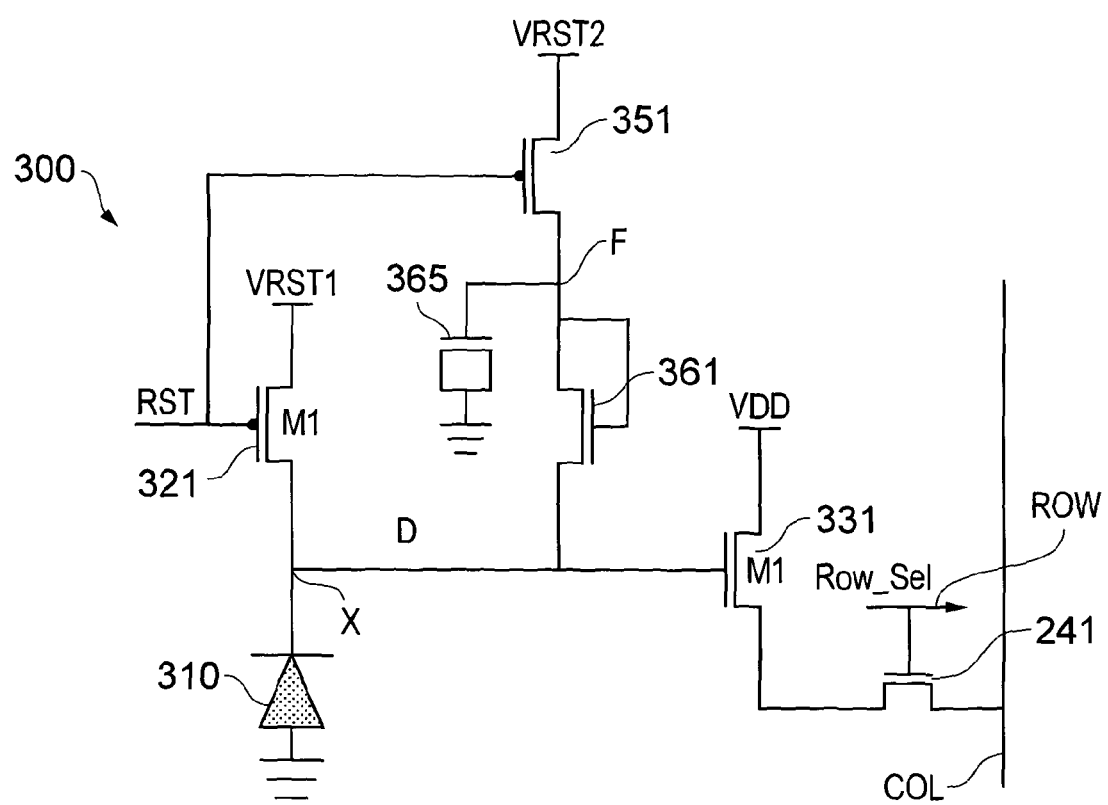
FIG. 4 is a schematic illustration of an active pixel of a CMOS radiation detector according to a further embodiment of the invention.

In the embodiment of FIG. 2(a) the first and second reset transistors 221, 251 are both nMOS transistor devices. It is to be understood that pMOS transistor devices may be used instead. FIG. 4 shows an active pixel element 300 according to a further embodiment of the invention substantially identical to the active pixel element 200 of FIG. 2(a) except that the first and second reset transistors 321, 351 are pMOS devices.

It is also to be understood that a mixture of pMOS and nMOS devices may be used in some embodiments by correcting the polarity of each RST line driving the gates according to the device type.

This may be an advantage when soft reset is desired on the photodiode 210 but hard reset can be accepted on the capacitor 265, to provide predictable pixel element behaviour and fast settling. Device 221 would then be an nMOS device while device 251 would be exchanged for a pMOS device. Alternatively, a hard reset may be desirable for the photodiode 210 (higher voltage) which can be better performed by means of a pMOS device as device 221. A hard reset could be performed of the capacitor 265 using an nMOS device as device 251 since the voltage can be lower ($V_{RST2}$) than the gate voltage of device 251.

Like features of the pixel element 300 of FIG. 4 to those of the pixel element 200 of the embodiment of FIG. 2(a) are provided with like reference signs prefixed numeral 3 instead of numeral 2.

It is to be understood that the pixel element 300 is arranged to operate in a corresponding manner to the pixel element 200 of FIG. 2(a) and its operation will not be described further herein.

It is to be understood that in some embodiments a cathode of the photodiode 210 may be connected to a supply having a suitable potential above ground, and an anode of the photodiode 210 may be connected to a diode element 260 of opposite polarity, specifically a PMOS device. Thus the value of $V_X$ will increase as the cumulative amount of incident radiation increases and charge is conducted through the photodiode 210 from the supply.

In some arrangements the pixel element 200, 300 is operable to apply reset pulses to the first and second reset transistors substantially independently of one another. This has the advantage that is may be ensured that the reset phase of the first reset transistor 251, 351 will not cause charge injection to the photodiode 210, 310.

It is to be understood that reset signals may be applied to the transistors in any suitable order.

Figure 5:
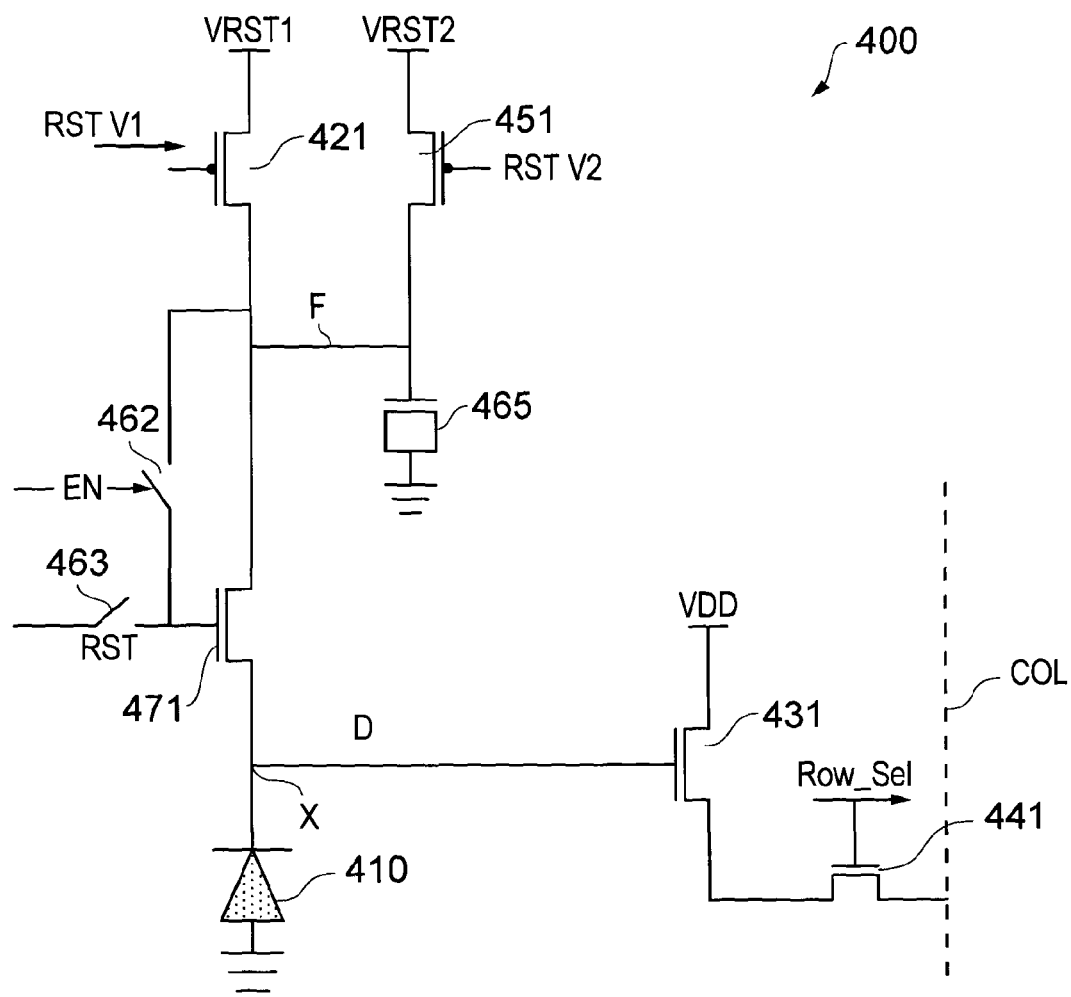
FIG. 5 is a schematic illustration of an active pixel of a CMOS radiation detector according to a still further embodiment of the invention.

FIG. 5 shows a pixel element 400 according to a further embodiment of the invention. The pixel element has a photodiode 410 coupled between ground and a floating node X in a similar manner to the embodiments of FIG. 2 and FIG. 4. The pixel element 400 has a reset signal line RST connected to the gate of a master reset transistor 471 via switch 463. The source of the master reset transistor 471 is connected to the floating node X whilst the drain is connected to a floating node F. Drain terminals of first and second reset transistors 421, 451 (being pMOS transistors) are connected to floating node F whilst source terminals of the transistors 421, 451 are connected to first and second supply potentials $V_{RST1}$, $V_{RST2}$ respectively. Gate terminals of the first and second reset transistors 421, 451 are connected to first and second reset signal lines RSTV1, RSTV2 respectively.

In the embodiment of FIG. 5 the pixel element 400 is operable to connect the gate and drain terminals of the master reset transistor 471 to one another by means of an enable switch 462 which is operable to close when an enable signal line EN is HIGH.

It is to be understood that when the enable signal line EN is HIGH and the enable switch 462 is closed, master reset transistor 471 functions as a diode element allowing current to flow from floating node F to floating node X when the potential $V_F$ at node F is greater than the potential $V_X$ at node X.

It is to be understood that the pixel element 400 of the embodiment of FIG. 5 is operable according to a number of different modes each having a different response characteristic in respect of $V_X$ as a function of the amount of incident illumination.

In a first mode of operation the potential at $V_X$ is arranged to vary in a similar manner to that of the corresponding floating node X of the prior art pixel element 100. Thus, with enable signal line EN LOW and enable switch 462 open while switch 463 is closed, the first reset transistor 421 is turned ON by means of first reset signal line RSTV1.

Similarly, the master reset transistor 471 is turned ON by means of master reset signal line RST. $V_X$ is thereby set to $V_{RST1}$.

The first and second reset transistors 421, 471 are then turned OFF thereby isolating node X from $V_{RST1}$ and node F. In some embodiments the first reset transistor 421 is maintained in the ON condition in this mode of operation of the pixel element 400.

Figure 6:
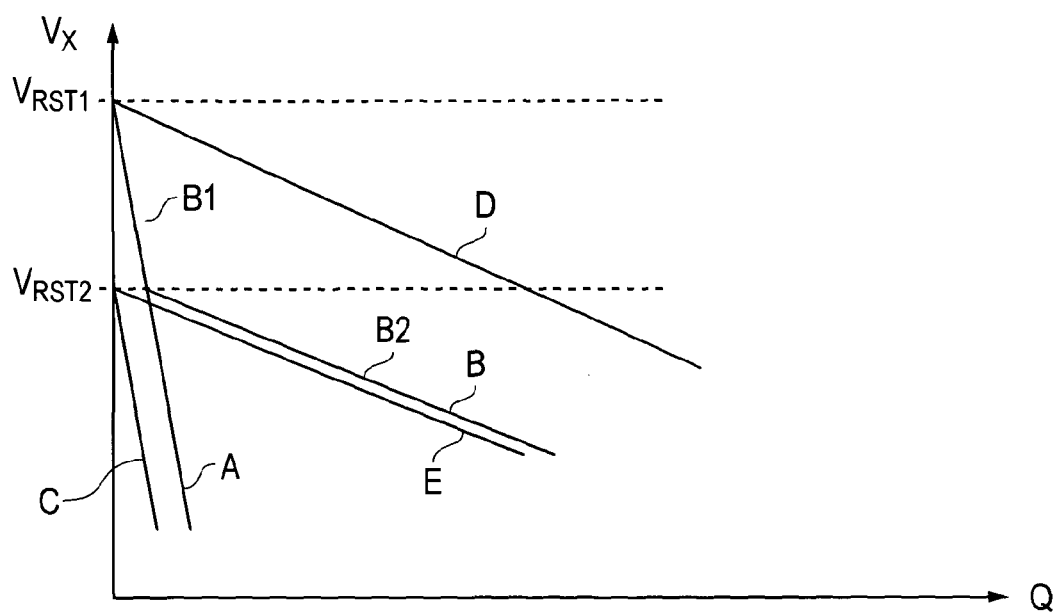
FIG. 6 is a plot of a potential as measured at node X of the circuit of FIG. 5 under constant illumination conditions for different modes of operation of the circuit.

FIG. 6 is a plot of the potential $V_X$ as a function of the amount of charge transported through the photodiode 410. It is to be understood that $V_X$ will fall as a function of the amount of incident radiation according to trace A of FIG. 6, being similar to trace A of FIG. 3.

Furthermore, it is to be understood that in a second mode of operation similar to the first mode the potential $V_X$ at floating node X may be arranged to change according to trace C by applying a potential $V_{RST2}$ to floating node X instead of $V_{RST1}$ by controlling the second reset transistor 451 in a similar manner to (and instead of) the first reset transistor 421.

In a third mode of operation the pixel element 400 is controlled such that the potential $V_X$ varies according to trace B of FIG. 6 as a function of the amount of incident illumination. It is to be understood that trace B is similar to trace B of FIG. 3. Thus the third mode of operation corresponds to the manner of operation of a pixel element 200 according to the first embodiment.

In the third mode of operation the first reset transistor 421 and the master reset transistor 471 are controlled by means of the master reset signal line RST and first reset signal line RSTV1 so as to set $V_X$ to a potential $V_{RST1}$.

It is to be understood that if nMOS reset devices are employed $V_X$ will be set to a potential close to $V_{RST1}$ but relatively slowly due to soft reset. In contrast, pMOS devices give a hard reset and fast settling of $V_X$ to a potential very close to $V_{RST1}$.

It is to be understood that the term 'soft reset' refers to a situation where the reset transistor is operating in the (deep) subthreshold regime at the end of the reset period. This situation arises from the combination of the applied reset gate voltage and reset drain voltage.

Often the reset gate 'on' voltage and the drain voltage are both Vdd and this leads to soft reset. Under soft reset, the photodiode and the reset drain do not reach thermal equilibrium. Carriers are emitted from the photodiode, over the effective barrier under the reset gate to the reset drain.

In the pixel 400 of FIG. 5 the reset will be soft due to nMOS transistor 471 in series with the first reset transistor 421 which is a pMOS device.

It is to be understood that whether a reset is a hard or soft reset will of course depend on the value of the reset voltage. Thus the reset voltage could be lowered in order to achieve a hard reset using an nMOS transistor. Alternatively the gate voltage may be increased.

The master reset signal line RST is then held LOW, turning OFF master reset transistor 471.

$V_F$ is then controlled to assume a value $V_{RST2}$ by means of the second reset transistor 451 which is then controlled to isolate the floating node F from the second supply potential VRST2. The enable signal line EN is then controlled so as to close enable switch 462 and open switch 463. As described above, the master reset transistor 471 subsequently functions as a diode.

As shown in trace B of FIG. 6, as the photodiode 410 conducts charge to ground under illumination $V_X$ falls from a value $V_{RST1}$ to a value $V_{RST2}$ (corresponding to portion B1 of trace B).

As $V_X$ falls below $V_{RST2}$ the master reset transistor 471 allows charge to flow from floating node F to the photodiode 410 reducing the rate of change of $V_X$ as a function of the amount of charge conducted through the photodiode 410. This allows the collection of a larger amount of charge before saturation of the photodiode 410 is reached.

In a fourth mode of operation $V_X$ is initially set to a value $V_{RST1}$ by means of first reset transistor 421 and master reset transistor 471. The master reset transistor 471 is then controlled to behave as a diode by closing switch 462 and opening switch 463, with $V_F$ remaining at a potential $V_{RST1}$.

It is to be understood that under these conditions as the photodiode 410 conducts current the rate of change of $V_X$ as a function of the amount of charge will be reduced compared with the case where the master reset transistor 471 is OFF and not conducting charge, as shown by trace D of FIG. 6. This is because capacitor 465 begins to discharge through the master reset transistor 471 as $V_X$ falls below $V_{RST1}$.

In a fifth mode of operation similar to the fourth mode $V_X$ is set initially to a value $V_{RST2}$ instead of $V_{RST1}$ by means of second reset transistor 451 and master reset transistor 471.

With the second reset transistor 451 also isolated from the second supply potential $V_{RST2}$ and master reset transistor 4710N, the change in $V_X$ as a function of the amount of charge Q passed through the photodiode 410 is substantially as shown in trace E of FIG. 6.

Other arrangements are also useful.

It is to be understood that in some embodiments a one dimensional array of pixel elements 200, 300, 400 is provided. In some other embodiments a two dimensional array of pixel elements 200, 300, 400 is provided. The pixel elements may be formed on a semiconductor substrate such as a silicon substrate.

In some embodiments a conducting layer such as a top metal conducting layer is formed over the pixel element array which is typically formed in a silicon wafer. The conducting layer is not connected to any circuit within the pixel element but is connected directly to one or more input/output pads of the array. Such pads are dedicated to discharging any external current that could be produced within the wafer surface due to contact, accumulation or field induction.

The input/output pads include supply or ground connections which are typically low impedance nodes to the substrate potential.

The presence of this conducting layer ensures that any electrostatic discharge (ESD) is routed to the interface pads (which are typically of low impedance as noted above) thereby protecting the pixel element circuits from damage.

It is to be understood that this may be important in some applications. For example, in some applications scintillators may be bonded on top of the pixel element array. A danger exists that the scintillator may cause an electrostatic discharge, destroying circuits of the array.

Embodiments of the present invention have considerably increased storage well capacities. Larger or smaller well capacities may also be obtained depending on the sizes of diode and capacitors used It is to be understood that the description and claims are not limited to a pixel element structure including only one charge storage device. In some embodiments of the invention a plurality of charge storage devices may be connected to node F. Furthermore any number of reset transistors and any number of different reset voltages may be employed.

Furthermore, the order in which control signals are provided to the transistors and any other switching devices for proper operation of a circuit as described herein may be modified. Thus control signals may be provided in a different order to that described or two or more control signals that are described as provided separately may be provided substantially simultaneously. Furthermore where two signals are described as provided simultaneously, in some embodiments the signals may be provided sequentially, one following the other substantially immediately.

Figure 7:
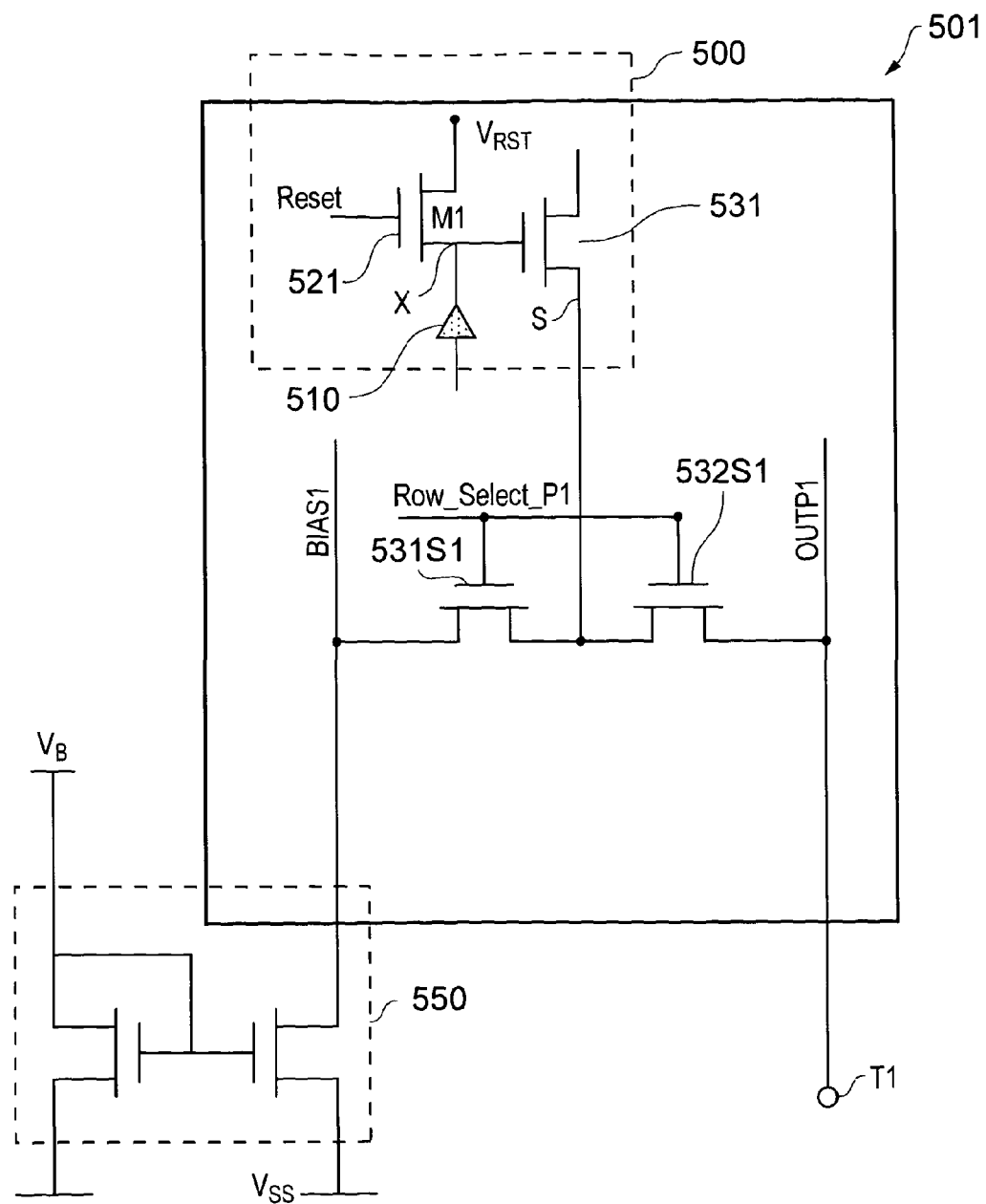
FIG. 7 shows a circuit according to a further embodiment of the invention illustrating a non-destructive readout architecture and taking into consideration biasing of an in pixel source follower to avoid image gradient effects.

FIG. 7 shows a circuit 501 according to a further embodiment of the invention. The circuit 501 has a pixel element 500 for which the potential at node X thereof is responsive to an amount of radiation to which the pixel element 500 has been exposed since the pixel element 500 was last reset by means of reset transistor 521 of the element 500.

The pixel element 500 is coupled to a pixel readout arrangement that has a current bias line BIAS1 and a pixel readout output line OUTP1. The current bias line BIAS1 is connected to a bias current source portion 550. Each pixel element 500 has a source follower input transistor 531 that may be coupled to the bias current source portion 550 to form a source follower arrangement when a bias line select transistor 531S1 is enabled as described below.

The bias current source portion 550 comprises a current mirror arrangement in the embodiment shown and is coupled to the current bias line BIAS1. The current bias line BIAS1 may in turn be coupled to the source terminal S of the source follower input transistor 531 by means of a bias line select transistor 531S1 when a row select signal Row_Select_P1 is enabled. The source terminal S is also connectable to the output line OUTP1 by means of an output line row select transistor 532S1 when Row_Select_P1 is enabled. Thus, when it is required to read out the potential at node X, Row_Select_P1 is enabled, causing a bias current to flow through source follower input transistor 531 and a potential to be presented at an output terminal T1 of output signal line OUTP1 corresponding to the potential at node X.

It is to be understood that providing a circuit having a separate bias line BIAS1 and output line OUTP1 is advantageous in some applications. This is because a potential corresponding to that of the source S may be read from an output terminal T1 of the output signal line OUTP1 without a requirement for current to flow through the output signal line OUTP1. This is because a bias current applied by bias portion 550 flows through bias line BIAS1 rather than through the output signal line OUTP1.

This feature has the advantage in turn that an amount of a drop in potential across the output signal line OUTP1 between the output line row select transistor 532S1 associated with a given pixel element and the output terminal T1 is substantially reduced (or substantially zero). This allows image gradient effects suffered in images captured by known pixel arrays (due to increased potential drops across output lines as a function of distance of a row of pixel elements from an output terminal) to be reduced (or substantially eliminated).

It is to be understood that relatively long lengths of output line OUTP1 may be required in certain applications (e.g. up to 15 cm for 8 inch wafers and longer distances for 12 inch wafers). Embodiments of the present invention may be particularly advantageous in such applications.

Where relatively long lengths of output line are required, embodiments of the invention have the advantage that captured images do not suffer from image gradient effects.

Embodiments of the invention find particularly advantageous use in applications where circuit architecture is constrained such that connections to a wafer or other substrate bearing the array of pixels is allowable from one side of the wafer only.

For example, in some applications an array of pixel elements 500 such as a 2D array comprising a plurality of rows of pixel elements 500 may be formed on a silicon wafer which is subsequently bonded to a well package substrate or 'well package'. Multiple wafers may be bonded to the same well package and arranged side by side in an abutting manner. In some arrangements a given wafer may have three wafers lying adjacent to it on each of three sides. The proximity of the other wafers may impose connectivity constraints such that electrical connection to the wafer may only be made along a single side of the wafer. Accordingly, readout signal lines may be required to cross substantially the entire width of a wafer in order to allow output of signals from pixels located away from the side of the wafer bearing the signal line outputs. It is to be understood that the bias portions 550, and bond pads associated with output terminals T1 and control electronics may be provided along a common edge in the embodiment of FIG. 7.

Thus, correct biasing of the source follower input transistor 531 of each pixel element 500 can be achieved without a requirement to include biasing or other electronics within the pixel element 500 itself in order to overcome this problem.

Figure 8:
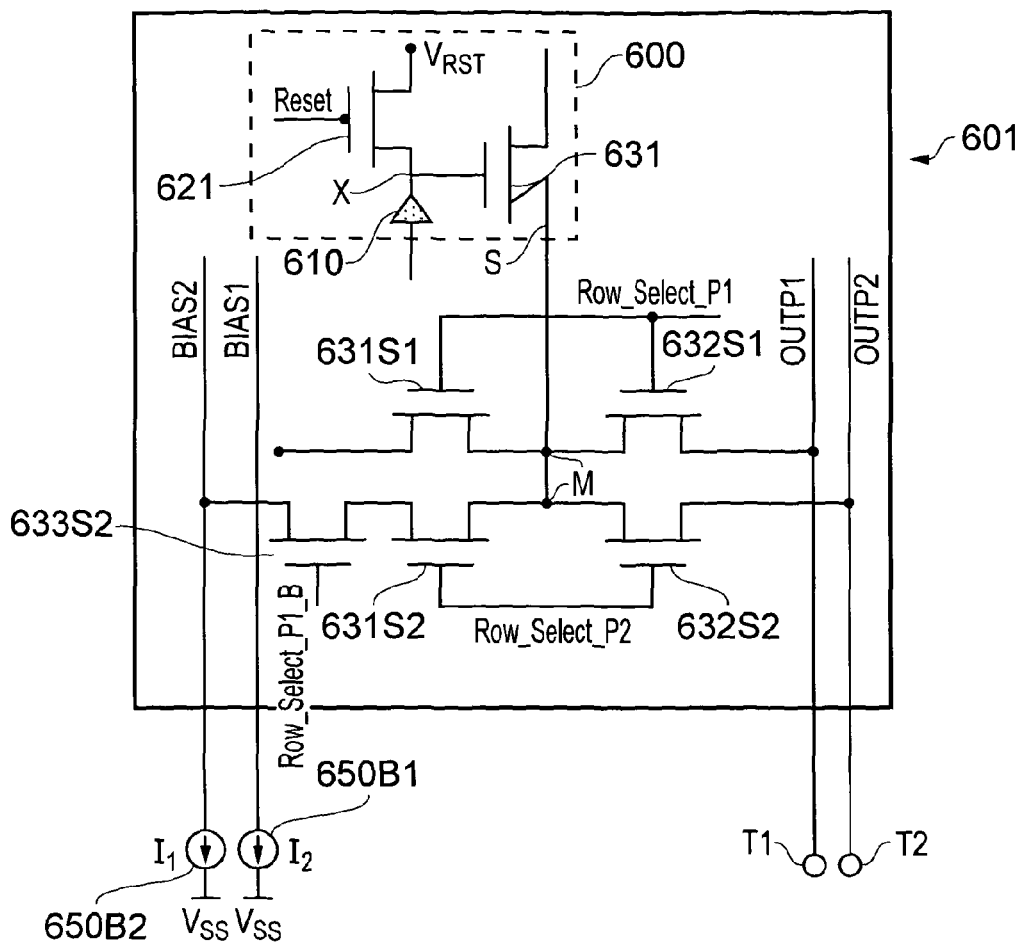
FIG. 8 shows a circuit according to a further embodiment of the invention having two bias current lines and two output lines.

FIG. 8 shows an embodiment similar to that of the circuit of FIG. 7 having two bias current lines BIAS1, BIAS2, each having an associated bias current portion 650B1, 650B2. In some embodiments the bias current portions 650B1, 650B2 are formed in the same substrate of wafer as the pixel elements 600 although in some alternative embodiments the bias current portions 650B1, 650B2 are provided on a separate substrate such as a well package substrate bearing the substrates in which the pixel elements 600 are formed.

The circuit 601 is operable to apply a potential to a selected one of the output lines OUTP1, OUTP2 that is responsive to a potential at node X of the pixel element 600.

The architecture shown allows two different row select signals (Row_Select_P1 and Row_Select_P2) to be used to read out the potential at source S of the source follower transistor 631 (corresponding to the potential at nodes M). The row select signals are controlled independently of one another.

As described above, current bias lines BIAS1, BIAS2 are arranged to apply respective bias currents to the source follower input transistor 631 enabling readout of the potential at node M to output lines OUTP1 or OUTP2 via row select transistor 632S1 and 632S2 respectively.

If Row_Select_P1 is enabled, source follower input transistor 631 is connected to bias line BIAS1 by means of bias line select transistor 631S1 whereby bias current portion 650B1 provides a bias current $I_1$ thereto. At the same time, output line row select transistor 632S1 connects output line OUTP1 to node M whereby the potential at node M is applied to an output terminal T1 of the output line OUTP1. The potential at the output terminal T1 may be sampled by output electronics which may be external to the pixel array.

Similarly, if Row_Select_P2 is enabled, source follower input transistor 631 is connected to bias line BIAS2 by means of bias line select transistor 631S2 whereby bias current portion 650B2 provides a bias current $I_2$ thereto. Output line row select transistor 632S2 connects output line OUTP2 to node M whereby the potential at node M is applied to an output terminal T2 of the output line OUTP2 where it may also be sampled by output electronics.

In some embodiments of the invention bias currents $I_1$ and $I_2$ are typically in the range of from around 5 microamps to around 20 microamps although any suitable current may be used. In some arrangements the bias currents $I_1$, $I_2$ are substantially the same although in some embodiments the currents $I_1$, $I_2$ may be different.

As shown in FIG. 8 bias line select transistor 631S2 is connected to current bias line BIAS2 by means of a further bias line select transistor 633S2. A signal Row_Select_P1_B being the inverse of signal Row_Select_P1 is applied to the gate of the further bias line select transistor 633S2. It is to be understood that the further bias line select transistor 633S2 is arranged to isolate bias line BIAS2 from node M whenever node M is connected to bias line BIAS1. This feature prevents node M (and therefore the source S of source follower input transistor 631) from being connected to both bias lines BIAS1, BIAS2 if row select signals Row_Select_P1 and Row_Select_P2 are both enabled simultaneously. If this situation were to occur the current drawn through the source follower input transistor 631 would be the sum of that through bias lines BIAS1, BIAS2 and the potential at node M might provide a misleading indication of the potential at node X. It is to be understood that the presence of further bias line select transistor 633S2 may be particularly useful in rolling shutter image capture applications.

However, it is to be understood that if row select signals Row_Select_P1 and Row_Select_P2 are both enabled simultaneously, the potential at node M may be read out simultaneously to output signal lines OUTP1, OUTP2. This feature allows simultaneous readout of the potential at node M to output terminals T1, T2.

A readout arrangement according to an embodiment of the present invention as described above has the advantage that a potential corresponding to that at node X may be effectively read out at respective output terminals T1, T2 of output lines OUTP1 and/or OUTP2 without a requirement for current to flow through either of the output lines OUTP1, OUTP2. This has the advantage that readout of the potential at node X may be performed in a reliable and accurate manner substantially independently of the length and therefore resistance of the output lines OUTP1, OUTP2.

In contrast, in the circuits of FIGS. 1, 2, 4 and 5 a current flow through the column output lines COL is required in order to allow readout of the potential at node X.

It is to be understood that by providing two output lines OUTP1, OUTP2 that are addressable substantially independently of one another, the potential at node X may be read out to different image capture circuits. In some embodiments the potential at node X may be read out at different rates by different circuits.

For example, a first circuit coupled to (say) output line OUTP1 may read out the potential at node M immediately before a reset signal is applied to reset transistor 621, allowing the potential at node M to be monitored following substantially maximum exposure of the pixel element 600 to radiation before the pixel element 600 is reset. Thus signal line Row_Select_P1 may be set high thereby to read out the potential at node M to output line OUTP1 once for every time a reset signal is applied to reset transistor 621 (and typically substantially immediately prior to the application of a reset signal to reset transistor 621).

A second circuit coupled to output line OUTP2 may read out the potential at node M more than once for every time a reset signal is applied to reset transistor 621. Thus signal line Row_Select_P2 may be set high thereby to read out the potential at node M to output line OUTP2 a plurality of times between successive applications of a reset signal to reset transistor 621.

This feature has the advantage that if a particular pixel element 600 or group of elements 600 becomes saturated between the application of one reset signal to reset transistor 621 and the next, it may be possible still to obtain an unsaturated signal. This is achieved by reading out the potential at node M via output signal line OUTP2 before the potential at node M is next read out to output line OUTP1. In some embodiments the second circuit may read out the potential at node M ten times for every reset signal applied to reset transistor 621. Other numbers and ratios of read out signals applied by the circuits between reset signals are also useful.

In some arrangements the first circuit may read out the potential at node M of each pixel element 600 (i.e. read out one frame of the array of elements 600) once every second whilst the second circuit may read out the potential ten times per second, i.e. read out or output 10 frames per second.

The circuits coupled to OUTP1 and OUTP2 may themselves be operable to select pixel elements 600 for which the potential at node M thereof is to be output. The circuits may be arranged to buffer data acquired thereby and to reset their buffers according to a control methodology.

Figure 9:
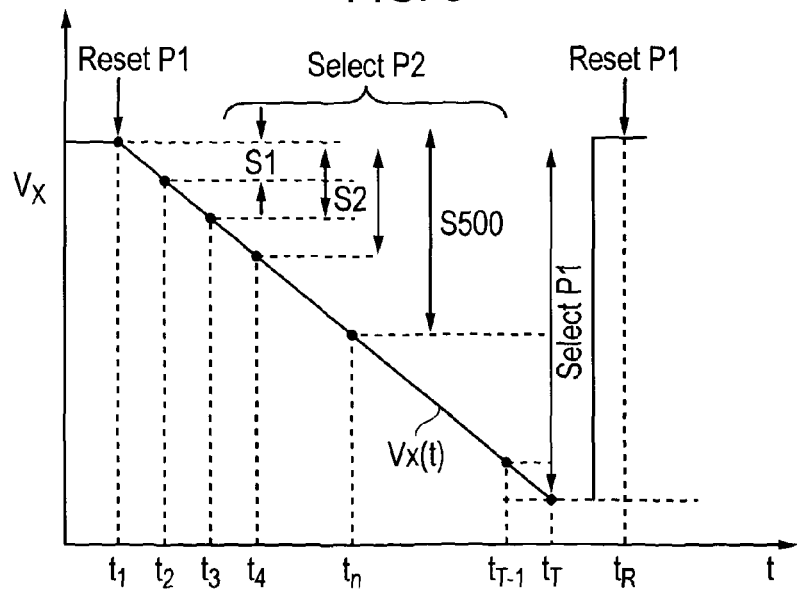
FIG. 9 is a timing diagram for operation of the circuit of FIG. 8 and illustrating non-destructive operation thereof.

FIG. 9 is a plot of the potential $V_X$ at node X as a function of time for one particular pixel element 600 of the embodiment of FIG. 8. It can be seen that at time $t_1$ a reset signal is applied to reset transistor 621, and $V_X$ is reset to reset potential $V_{RST}$.

At time $t_2$ signal line Row_Select_P2 is set HIGH momentarily, allowing the potential at node M (corresponding to that at node X) to be read out to line OUTP2. Once the potential has been read the signal line Row_Select_P2 returns to logical LOW.

At time $t_3$ signal line Row_Select_P2 is again momentarily set HIGH before being set back to LOW, allowing the potential at node M to be again read out to line OUTP2. This process is repeated at times $t_4, \ldots t_n, \ldots t_{T-1}$. At time $t_T$ signal line Row_Select_P1 is momentarily set HIGH before being set back to LOW. This allows the potential at node M to be read out to output signal line OUTP1.

At time $t_R$ a reset potential is applied to the input of reset transistor 621 causing the potential at node M to be reset to $V_{RST}$. The process of reading out the potential at node M to output signal line OUTP2 at successive time intervals, followed finally by reading out the potential at node M to output signal line OUTP1, then repeats.

It is to be understood that the reset potential may be applied to the input of reset transistor 621 after the process of outputting the potential at node M to output signal line OUTP2. However in the embodiment shown this would reset all of the pixel elements 600 of a given row. Of course, in some embodiments resetting of individual pixel elements 600 or groups of pixel elements 600 may be possible.

It is to be understood that embodiments of the invention have the advantage that non-destructive readout of a potential corresponding to that of node X may be performed allowing output of a signal corresponding to the potential at node X to a plurality of different output signal lines OUTP1, OUTP2. In some embodiments the potential is not read out in a non-destructive manner, since the act of reading out the potential at node X results in a change in the potential at node X.

Figure 10:
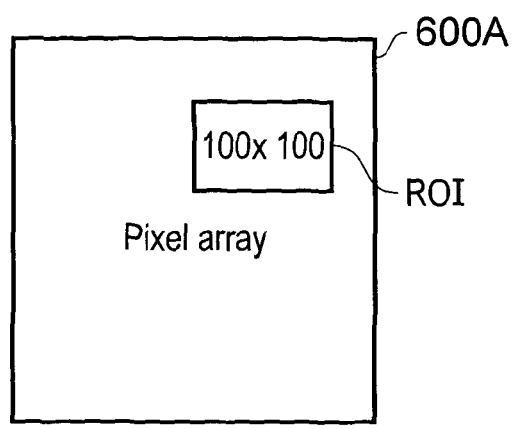
FIG. 10 shows a pixel array in which region of interest ROI is highlighted.

FIG. 10 shows a plan view of a pixel array 600A consisting of an array of 1000×1000 pixel elements 600. In the arrangement shown a user has identified a region of interest ROI comprising 100×100 pixels.

A controller of the array (not shown) controls the array such that the potential at node X of each of the pixel elements 600 comprised by the ROI is read out at a rate that exceeds that at which the potential at node X of the remaining (non-ROI) pixel elements 600 is read out.

Thus a first circuit may read out all of the pixels of the array at one frame rate (to output lines OUTP1) whilst a second circuit may read out the pixels of the ROI at another frame rate, to output lines OUTP2. The frame rate of the second circuit may be greater than that of the first circuit. Alternatively the frame rate of the first circuit may be greater than that of the second circuit.

In some embodiments the potential at node X of each of the pixel elements comprised by the ROI may be read out at a rate of 700 frames per second or any other suitable number.

The rate at which frames are read out from the non-ROI pixel elements 500 may be any suitable rate, optionally one frame per reset signal applied to reset transistors 621 of each element, just before the reset signal is applied. Other arrangements are also useful.

It is to be understood that one of the first or second circuits may be operable to reset the pixel elements 600 in each row by means of a reset signal applied to reset transistors 621. Advantageously the circuit operating at the lower frame rate is configured to accomplish this task, for example immediately after outputting a frame.

Embodiments of the invention have the advantage that a single pixel array may be controlled to act in a manner effectively simulating two pixel arrays because a potential corresponding to that at node X may be read out to two different sets of output signal lines OUTP1, OUTP2. A multiplexing circuit arrangement that might otherwise be required if only a single set of output lines OUTP1 were provided is therefore not required.

In some systems according to the present invention, respective first and second circuits are arranged to read out the potential at node X of respective different pixel elements 600 of the embodiment of FIG. 8 to respective different output lines OUTP1, OUTP2. Thus, the circuits may be arranged to output a signal corresponding to the potential at node X of one set of pixel elements 600 to one set out output lines OUTP1 and a signal corresponding to the potential at node X of the remaining pixel elements 600 to another set out output lines OUTP2. Thus the first and second circuits read out signals corresponding to Vx in different pixel elements 600.

It is to be understood that in some arrangements more than two sets of output lines OUTP1, OUTP2 are also useful, such as three, four, five or more.

A system incorporating a pixel array according to an embodiment of the present invention may therefore effectively be used to provide two imaging cameras having respective image capture and image data management electronics but a common pixel element array. Node potentials of pixel elements of the array may be read out separately to the electronics associated with the respective cameras as required.

In some embodiments, correlated double sampling (CDS) is employed to improve signal to noise ratio of signals output by the circuit 601.

It is to be understood that the reset transistor described with respect to embodiments of the present invention such as transistor 521, 621 can be either a PMOS or an NMOS transistor device.

A further advantage of the architecture shown in FIG. 7 and FIG. 8 is that respective output and biasing lines are separated. As indicated above, this gives the advantage that the bias current portions 550, 650 can be placed either at the 'top' or at the 'bottom' of the pixel array. This allows a true one or two or three side buttable detector to be provided without the introduction of an artificial gradient into a sampled (or captured) image as described above.

In conventional 3T pixel architecture it is considered good practice to place the current bias portion providing bias current on an opposite side of the pixel array from output terminals of the array at which the potential of the source of the source follower input transistor is being read out. In this way it is ensured that the bias current is flowing in the opposite direction to that from which sampling is taking place so that line resistance does not affect the sampled output value. However, if wafers on which pixels are formed are butted one against another on a substrate, it is difficult to connect the bias current portions (or output line terminals) to the substrate. Accordingly, the present applicant has recognised that if separate output and bias current lines are provided, both the current bias portions and output terminals may be provided along a common side of the array.

It is to be understood that some embodiments of the present invention have the advantage that gradients in output potential due to output line resistance, resulting in potential variations from the top to the bottom of the pixel array may be reduced or substantially eliminated whilst at the same time allowing power and control signals to be applied to the pixel element array from only one side of the array.

Figure 11:
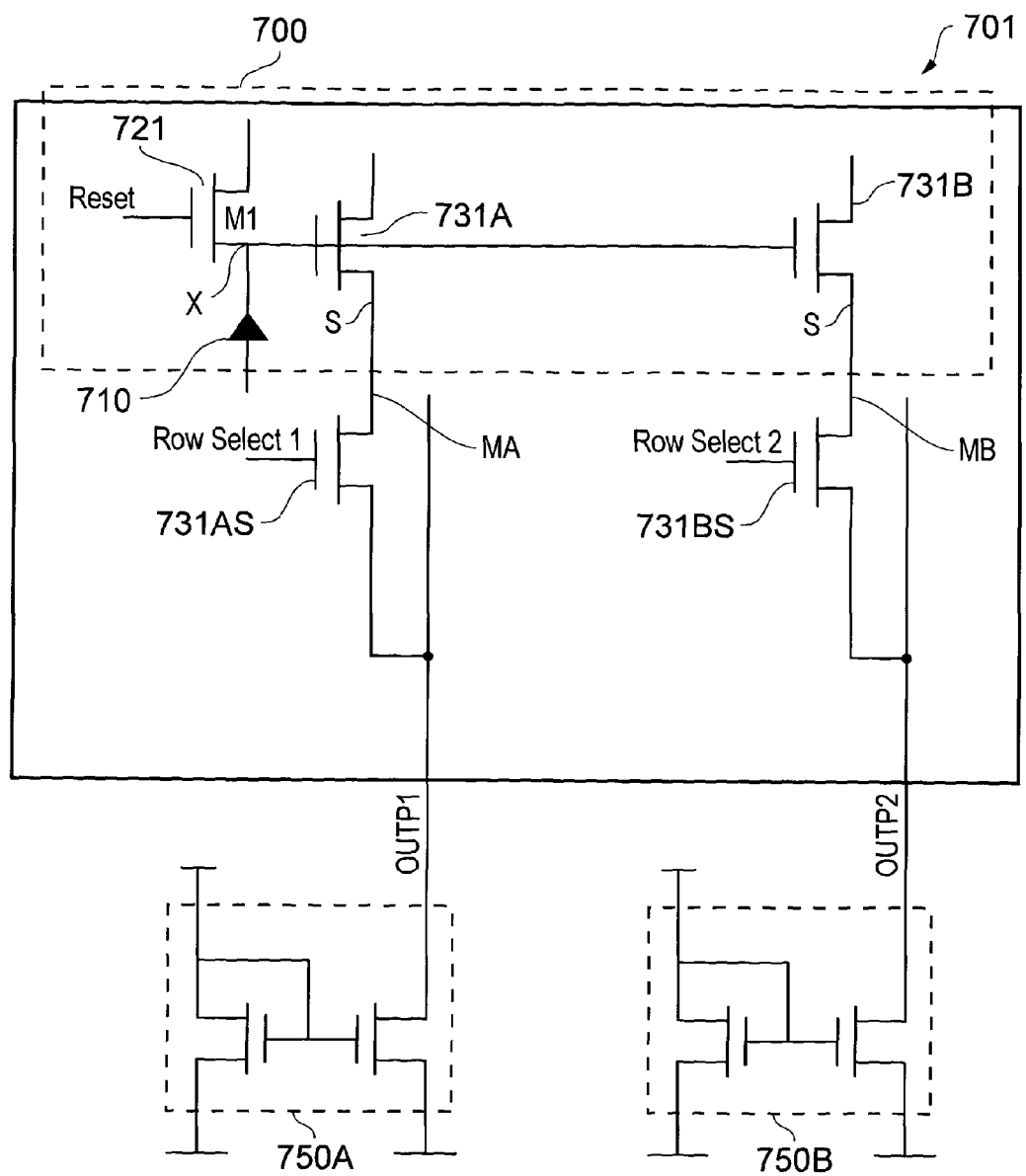
FIG. 11 shows a circuit in which a pixel element as two source follower input transistors connected to respective different output lines.

FIG. 11 shows a circuit according to a further embodiment of the invention. Corresponding features of the embodiment of FIG. 11 to those of the embodiment of FIG. 7 are shown with like reference signs prefixed numeral 7 instead of numeral 5.

In the embodiment of FIG. 11 a circuit 701 is provided in which a pixel element 700 has two source follower input transistors 731A, 731B each connected to a node X of the pixel element 700. Node X is a potential at a terminal of photodetector 710, the potential corresponding to an amount of charge carriers generated in photodetector 710 by incident radiation.

The circuit 700 has two output lines OUTP1, OUTP2 having bias current portions 750A, 750B connected thereto. Each bias current portion 750A, 750B comprises a current mirror circuit arranged to form a source follower circuit arrangement with the source follower input transistors 731A, 731B. Respective row select transistors 731AS, 731BS are operable to apply the potential at the source S of each source follower input transistor 731A, 731B to a respective output line OUTP1, OUTP2 when required.

The circuit 701 has the feature that two output lines OUTP1, OUTP2 may be provided simultaneously with an output potential corresponding to that of node X of the same pixel element 700. Thus in some embodiments two entirely separate and independent circuits external to the circuit 701 may be provided with signals corresponding to the potential at node X of the same pixel element 700.

Embodiments such as that of FIG. 11 having two or more source follower input transistors 731A, 731B connected to respective output lines OUTP1, OUTP2 may be implemented with a corresponding two or more respective bias lines BIAS1, BIAS2 as described above with respect to the embodiment of FIG. 8. It is to be understood that each source follower transistor may be provided with a respective one or more bias lines BIAS1 in addition to output lines OUTP1, OUTP2. Such embodiments have advantages similar to those of the embodiment of FIG. 7 in that current bias portions 750A, 750B may be provided on the same side of a pixel element array as output terminals T without the introduction of the image gradient effects described above.

Figure 12:
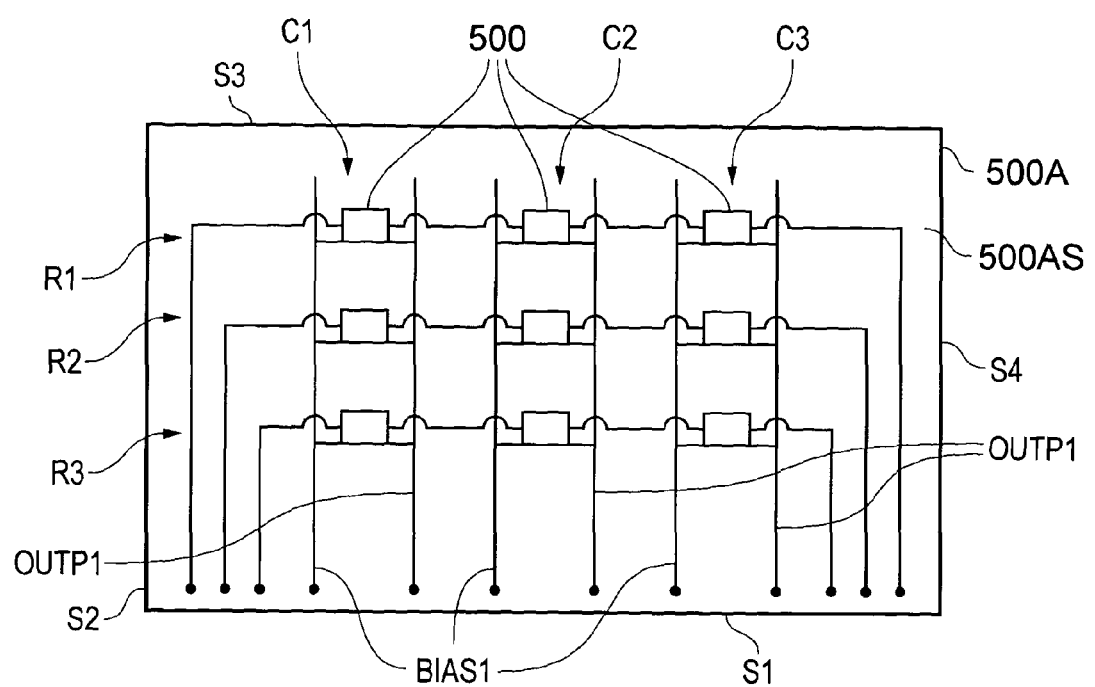
FIG. 12 shows a pixel element array according to an embodiment of the invention in which electrical connection to the array is made along a single side of the array.

FIG. 12 shows a pixel element array 500A comprising pixel elements 500 according to the embodiment of FIG. 7 although the array may also comprise pixel elements according to other embodiments of the invention. The array 500A is formed on a substrate 500AS and comprises three columns C1, C2, C3 of pixel elements 500, each column having three pixel elements 500. It can be seen that the pixel element array may also be considered to be formed from three rows R1, R2, R3 each of three pixel elements 500.

Electrical connection to the array 500A is made along a single side of the array 51 as shown. Along side 51 each of the bias current signal lines BIAS1 and output signal lines OUTP1 are provided with terminals allowing electrical connection thereto.

Other terminals are also provided to allow power to be supplied to the pixel elements. In addition, terminals for allowing connection of other control signal lines to external control circuits are provided such as select signal lines, reset signal lines and the like.

The arrangement of FIG. 12 has the advantage that the substrate 500AS may be surrounded on each of three sides S2, S3, S4 by other substrates and yet still allow electrical connection to be made thereto along side S1 without the problem of the introduction of image gradient effects into captured image data as described above.

It is to be understood that where embodiments of the present invention have been described with respect to image capture, the embodiments are equally suitable for measuring radiation intensity without forming images and such descriptions are merely by way of example. They are not to be construed as limiting the scope or application of the claimed invention.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. A detector comprising an array of pixel elements, the array comprising a column of pixel elements, each pixel element comprising a source follower input transistor,
    wherein each pixel element is operable to apply a potential to a gate terminal of the source follower input transistor thereof, the potential having a value responsive to a cumulative amount of charge carriers generated by the pixel element responsive to incident radiation, a source of each source follower input transistor being connectable by means of a respective bias line select transistor to a bias current signal line of the column having a bias current portion connected thereto, wherein the source follower input transistor and bias current portion form a source follower arrangement via the bias line select transistor,
    the source of the source follower input transistor of each pixel element being further connectable by means of a respective output line select transistor to an output signal line of the column separate from the bias current signal line.

2. A detector as claimed in claim 1 comprising a plurality of columns of pixel elements, each column having:
    a respective bias signal line having a bias portion; and
    a respective output signal line.

3. A detector as claimed in claim 1 wherein the column comprises respective first and second bias current signal lines connectable by means of respective first and second bias line select transistors to the source of the source follower.

4. A detector as claimed in claim 3 wherein each bias current signal line has a respective bias current portion.

5. A detector as claimed in claim 1 wherein the column comprises respective first and second output signal lines connectable by means of respective first and second output line select transistors to the source of the source follower.

6. A detector as claimed in claim 5 operable to apply the potential at the source of the source follower input transistor to both the first and second output lines at the same moment in time.

7. A detector as claimed in claim 6 operable to connect only one bias current signal line to the source of the source follower when more than one output signal line is connected to the source of the source follower input transistor.

8. A detector as claimed in claim 1 wherein the or each bias current portion comprises a constant current source.

9. A detector as claimed in claim 1 wherein electrical connections to each of the bias signal lines and each of the output signal lines of the detector are provided along a single common side of the detector.

10. A detector assembly comprising a plurality of detectors as claimed in claim 1.

11. An assembly as claimed in claim 10 comprising first, second, third and fourth detectors each having four sides, the first detector having the second to fourth detectors arranged to abut three respective sides thereof, wherein electrical connection to the bias current signal lines and output signal lines of the first detector is provided along a free edge of the detector not having any one of the second to fourth detectors in abutment therewith.

12. A method of detecting radiation comprising:
    providing a detector comprising an array of pixel elements, the array comprising a column of pixel elements, each pixel element comprising a source follower input transistor;
    applying a potential to a gate terminal of the source follower input transistor of a pixel element, the value of the potential being responsive to a cumulative amount of charge carriers generated by the pixel element responsive to incident radiation;
    connecting a source of each source follower input transistor by means of a respective bias line select transistor to a bias current signal line thereby to apply a bias current to the source follower input transistor thereby to form a source follower arrangement;
    further connecting the source of the source follower input transistor by means of a respective output line select transistor to an output signal line separate from the bias signal line.

* * * * *